(12) United States Patent
Hopkins et al.

(10) Patent No.: US 9,424,166 B2
(45) Date of Patent: Aug. 23, 2016

(54) ROUTING DEBUG MESSAGES

(71) Applicant: UltraSoC Technologies Ltd, Cambridge (GB)

(72) Inventors: Andrew Brian Thomas Hopkins, Folkestone (GB); Iain Craig Robertson, Cople (GB)

(73) Assignee: ULTRASOC TECHNOLOGIES LIMITED, Cambridge (GB)

( * ) Notice: Subject to any disclaimer, the term of this patent is extended or adjusted under 35 U.S.C. 154(b) by 84 days.

(21) Appl. No.: 14/251,260

(22) Filed: Apr. 11, 2014

(65) Prior Publication Data
US 2015/0268302 A1 Sep. 24, 2015

(30) Foreign Application Priority Data

Mar. 20, 2014 (GB) .................................. 1404994.4

(51) Int. Cl.
| | | |
|---|---|---|
| *G06F 11/00* | (2006.01) | |
| *G06F 11/36* | (2006.01) | |
| *G01R 31/317* | (2006.01) | |
| *G01R 31/3177* | (2006.01) | |

(52) U.S. Cl.
CPC ....... *G06F 11/3656* (2013.01); *G01R 31/3177* (2013.01); *G01R 31/31705* (2013.01); *G01R 31/31721* (2013.01); *G01R 31/31723* (2013.01); *G06F 11/36* (2013.01); *G06F 11/3648* (2013.01)

(58) Field of Classification Search
CPC ............... G06F 11/3648; G06F 11/36; G06F 11/3656; G01R 31/31705; G01R 31/3177; G01R 31/31723; G01R 31/31721
USPC ............................. 714/34, 25, 27, 30, 37, 45
See application file for complete search history.

(56) References Cited

U.S. PATENT DOCUMENTS

| | | | | |
|---|---|---|---|---|
| 7,080,283 B1* | 7/2006 | Songer | ................ | G06F 11/3636 714/30 |
| 7,627,784 B1* | 12/2009 | Allen | ................... | G06F 11/3636 714/30 |
| 2009/0319802 A1* | 12/2009 | Walmsley | ............ | B41J 2/17546 713/189 |
| 2011/0307741 A1* | 12/2011 | Chen | ................... | G06F 11/3648 714/38.1 |

(Continued)

FOREIGN PATENT DOCUMENTS

| | | |
|---|---|---|
| GB | 2501333 B | 3/2014 |
| JP | 0512069 | 1/1993 |

OTHER PUBLICATIONS

Application No. GB1404994.4; Search Report under Section 17 dated Apr. 11, 2014 and Search and Examination Report under Sections 17 & 18(3) dated Apr. 14, 2014.

*Primary Examiner* — Joseph D Manoskey
(74) *Attorney, Agent, or Firm* — Vorys, Sater, Seymour and Pease LLP; Vincent M DeLuca (57) ABSTRACT

An integrated circuit chip device comprising: system circuitry; debugging circuitry configured to debug the system circuitry, the debugging circuitry being segmented into zones; wherein the debugging circuitry comprises an interconnect fabric configured to route debug messages through a zone from a zone entry node of the interconnect fabric to a zone exit node of the interconnect fabric; and wherein the debugging circuitry is configured to, on receiving a debug message at a zone entry node that is shorter than a specified length, modify the debug message to form a modified debug message by increasing the length of the debug message to the specified length.

20 Claims, 7 Drawing Sheets

(56) References Cited

U.S. PATENT DOCUMENTS

2012/0110353 A1* 5/2012 Ehrlich .............. G06F 1/3203
713/300

2014/0068344 A1* 3/2014 Miller ................... G06F 11/26
714/45

* cited by examiner

ROUTING DEBUG MESSAGES

BACKGROUND

This disclosure relates to debugging circuitry on an integrated circuit chip. The disclosure is particularly relevant to routing debug messages through debugging circuitry of an integrated circuit chip device.

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for debugging the core devices, because debugging tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of debugging tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external debugging tools to find and solve bugs within the system in the timescales demanded by the industry.

Thus, the development of SoC devices required associated development in debugging technology, which lead to the integration of some debug functionality onto the SoC. It is now customary for each core device to have an associated debug unit. Typically, the debug unit can observe the core device, for example by collecting trace data from that core device. The collected debug data is assembled into debug messages and routed through the integrated circuit chip, typically to be funneled off chip via a debug port to external debugging tools. The quantity of debug data collected by the debug units is often huge, and thus high efficiency and low latency in exporting that debug data is important. To achieve high efficiency, it is desirable to maximise the proportion of each debug message which is carrying debug data, and minimise the proportion of each debug message carrying control data. Low latency requires that data is exported shortly after being gathered rather than waiting for significant further data to be buffered. For this reason, simple packet formats are used to transmit debug messages. Typically, the header of each packet has a length field which specifies the length of the packet. Thus, the end of one packet and the beginning of the next packet can be distinguished.

In order to reduce power consumption, typically parts of the SoC are powered down when they are not in use. Thus, at any one time, part of the SoC is powered up and part of the SoC is powered down. A problem occurs if a debug packet is part way through being sent when the unit sending the debug packet powers down. The resulting debug packet is shorter than the length specified in its header. This causes corruption, for example it may lead to downstream units incorrectly identifying where the packet ends. A similar problem occurs when communications are between separate SoC devices of a multi-chip module (MCM) that share a common debug port to the external debugging tools, as one of those SoC devices may be powered down.

One solution to this problem is to ensure from a higher level protocol on the SoC that the unit sending the debug packet cannot power down part way through sending the debug packet. For example, it is known to use a handshake protocol during power down to provide a time period during which messages which are part way through being sent or received are completed prior to power down. However, it may not be possible or desirable to implement such a handshake procedure into the operation of the SoC. For example, the unit sending the debug packet may be a semi-autonomous part of a larger sub-system, and integrating a power-down handshake impractical or undesirable. As another example, the power down capability may have been added as an additional feature or wrapper to an already complete subsystem, and thus integrating a power down handshake procedure impractical or undesirable. In any case, it is undesirable to alter the operation of the SoC for the convenience of the debugging circuitry, because the debugging circuitry is generally intended to passively observe the operation of the SoC.

Another solution to the problem is to use a store and forward mechanism. In other words, the circuitry which routes the debug packets through the SoC collects the whole of a debug packet before routing it on. If this circuitry receives only a partial or corrupted message it may discard it. Thus, the corruption is not propagated downstream. Alternatively, this circuitry may correct the length field in the header of the debug packet to reflect the actual length of the packet. Thus, the corruption is not propagated downstream. However, storing the whole debug packet before routing it downstream introduces an unacceptably high latency into the process of transporting the debug data. Additionally, storing the whole debug packet requires additional chip area to be utilised for the store, and chip power to be used to maintain that store.

Thus, there is a need for a low latency solution to routing debug messages in an integrated circuit chip whose lengths have become corrupted, for example as a result of powering down part of the chip.

SUMMARY OF THE INVENTION

According to a first aspect of this disclosure, there is provided an integrated circuit chip device comprising: system circuitry; debugging circuitry configured to debug the system circuitry, the debugging circuitry being segmented into zones; wherein the debugging circuitry comprises an interconnect fabric configured to route debug messages through a zone from a zone entry node of the interconnect fabric to a zone exit node of the interconnect fabric; and wherein the debugging circuitry is configured to, on receiving a debug message at a zone entry node that is shorter than a specified length, modify the debug message to form a modified debug message by increasing the length of the debug message to the specified length.

Suitably, the debugging circuitry is configured to output the modified debug message from the zone exit node.

Suitably, the zones are power zones, and one zone is configured to be in a high power mode whilst another zone is configured to be in a low power mode.

Suitably, the debugging circuitry is configured to receive the debug message at the zone entry node from a zone which transitioned from a high power mode to a low power mode whilst sending the debug message.

Suitably, the debugging circuitry is configured to receive the debug message from a portion of the system circuitry which transitioned from a high power mode to a low power mode whilst sending the debug message.

Suitably, the debugging circuitry is configured to determine the specified length of the debug message from the header of the debug message.

Suitably, the debugging circuitry is configured to determine that the debug message is shorter than the specified length by: counting the number of bytes in the debug message; comparing the counted number of bytes to the specified length; and determining that the counted number of bytes is less than the specified length.

Suitably, the zone entry node is configured to modify the debug message.

Suitably, the zone exit node is configured to modify the debug message.

Suitably, the zone entry node is configured to: determine that the debug message is shorter than the specified length; and add a termination marker to the debug message to identify the end of the debug message.

Suitably, the debugging circuitry is configured to add a corruption marker to the debug message to indicate that the debug message is corrupted.

Suitably, the debugging circuitry is configured to add a corruption marker to a further debug message to indicate that the debug message is corrupted.

Suitably, the zone exit node is configured to discard debug messages which have been indicated as corrupted by a corruption marker.

Suitably, the integrated circuit chip device comprises a destination unit, and the interconnect fabric is configured to route the debug message to the destination unit, and the destination unit is configured to discard debug messages which have been indicated as corrupted by a corruption marker.

Suitably, the debugging circuitry comprises debug units, and the interconnect fabric is configured to route the debug message from a debug unit to a debug controller.

Suitably, the integrated circuit chip device comprises the debug controller.

Suitably, the interconnect fabric is configured to route the debug message from a debug unit to an off-chip debug controller.

Suitably, the debugging circuitry comprises a destination unit, and the interconnect fabric is configured to route the debug message to the destination unit, and the destination unit is configured to not change its configuration in response to receiving a modified debug message.

Suitably, the system circuitry and debugging circuitry are integrated on the same integrated circuit chip.

Suitably, the system circuitry and debugging circuitry are comprised across two or more integrated circuit chips of a multi-chip module.

According to a second aspect of this disclosure, there is provided a method of routing debug messages through an integrated circuit chip device comprising system circuitry and debugging circuitry, the debugging circuitry being segmented into zones, the debugging circuitry comprising an interconnect fabric, the method comprising: debugging the system circuitry; routing debug messages through a zone of the debugging circuitry from a zone entry node of the interconnect fabric to a zone exit node of the interconnect fabric; receiving a debug message at a zone entry node that is shorter than a specified length; and modifying the debug message to form a modified debug message by increasing the length of the debug message to the specified length.

BRIEF DESCRIPTION OF THE DRAWINGS

The present disclosure will now be described by way of example with reference to the accompanying drawings. In the drawings.

DETAILED DESCRIPTION

The following disclosure describes a debug architecture suitable for implementation on a SoC or an MCM.

Figure 2:
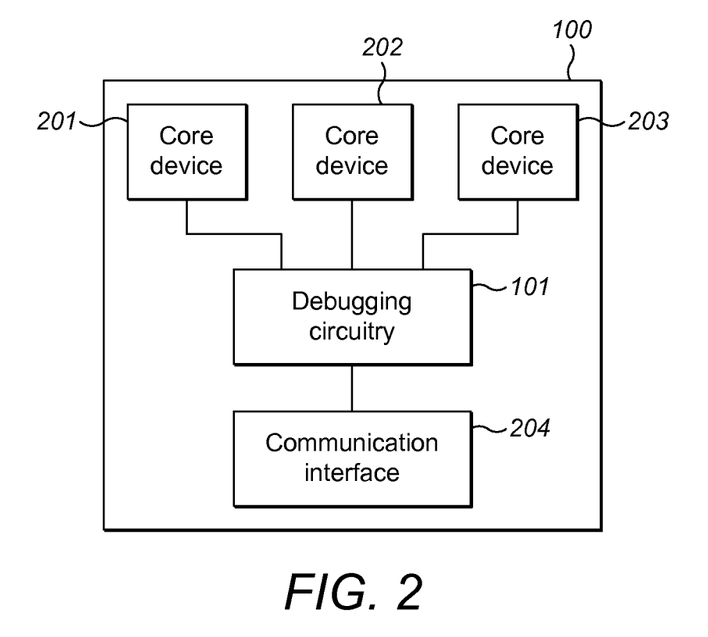
FIG. 2 is a schematic drawing of an exemplary debug architecture on an integrated circuit chip device.
Figure 3:
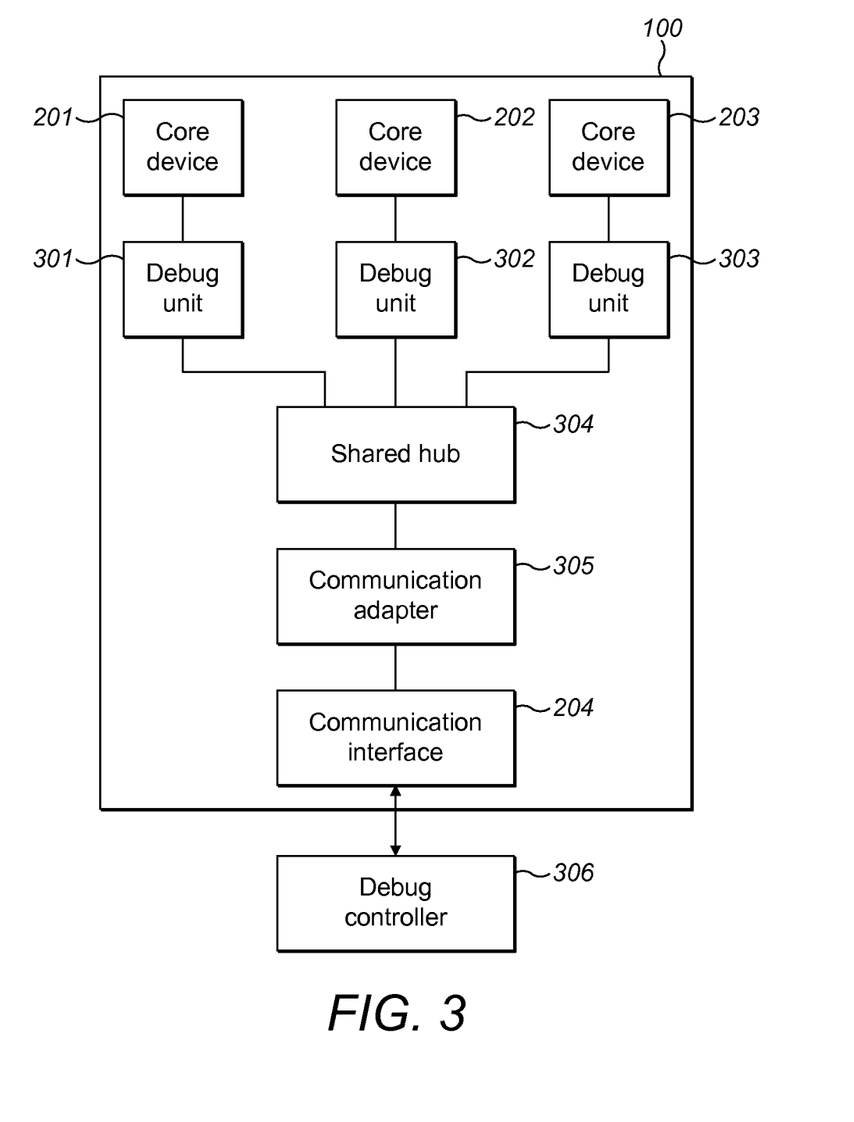
FIG. 3 is a schematic drawing of an exemplary debug architecture comprising a shared hub.
Figure 4:
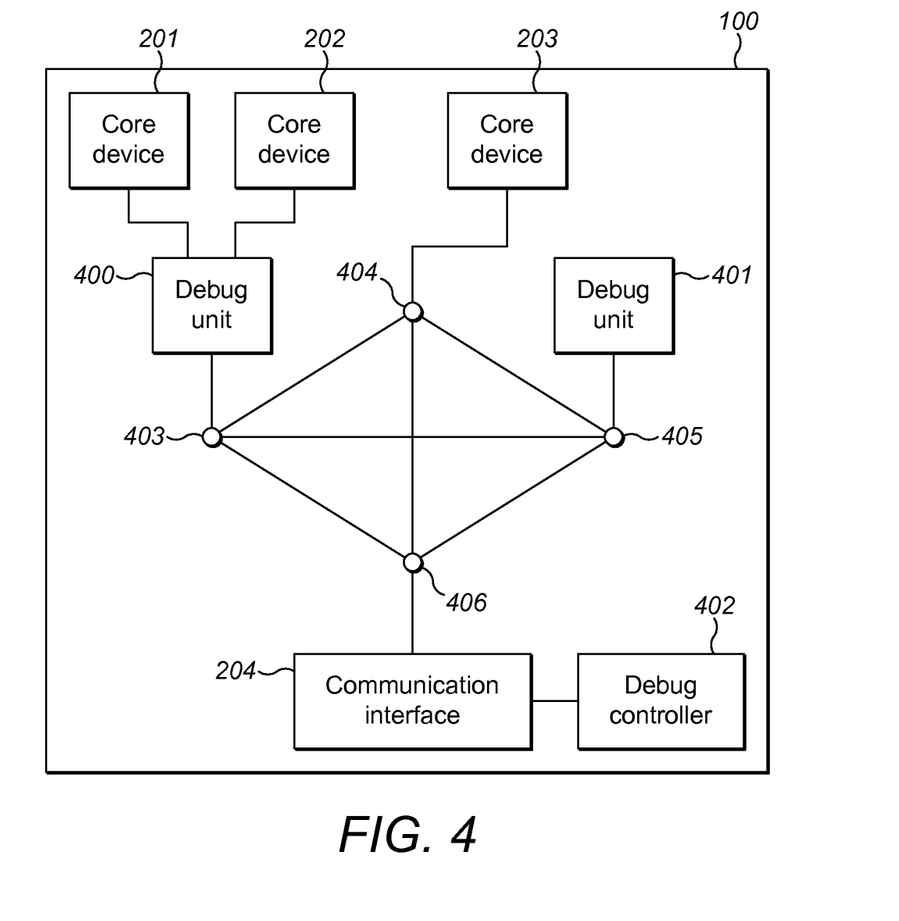
FIG. 4 is a schematic drawing of an exemplary debug architecture comprising a mesh network.
Figure 10:
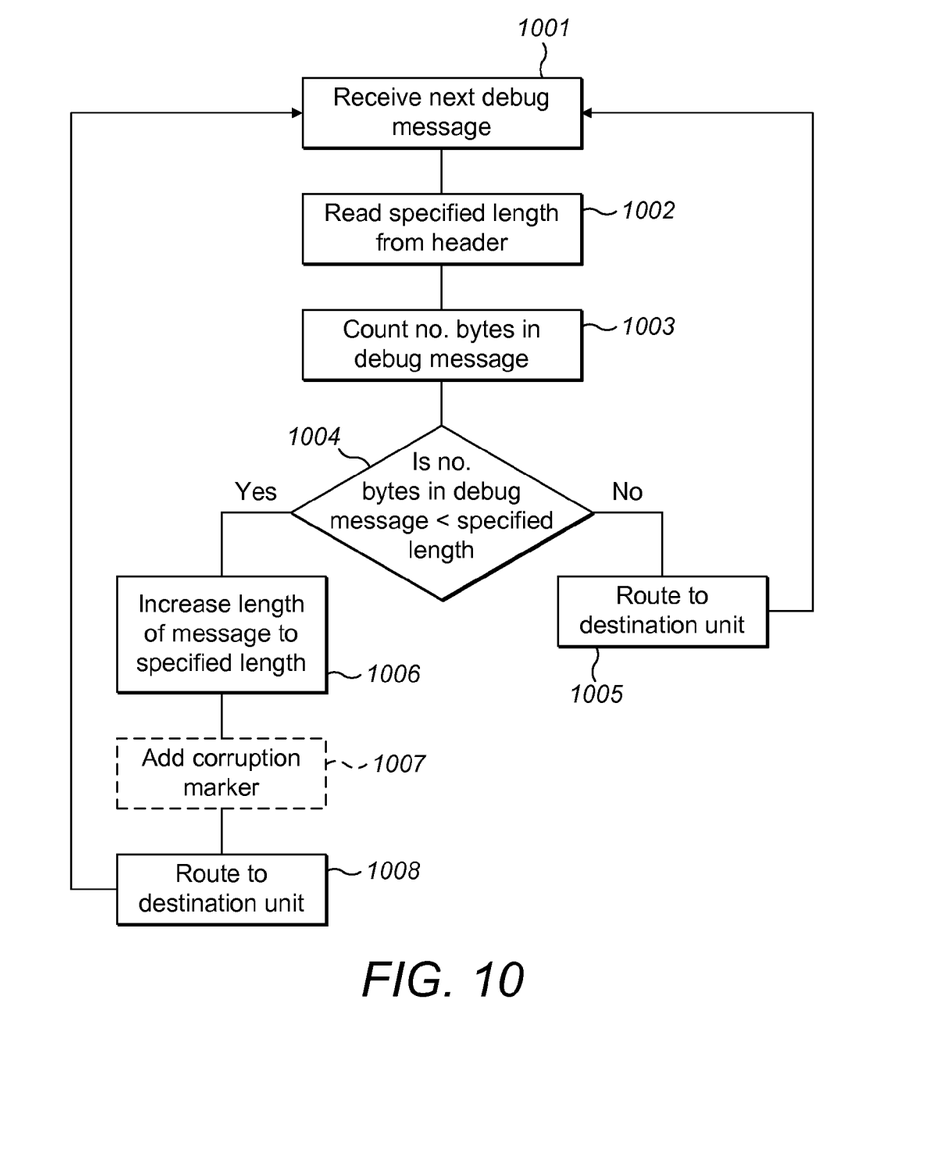
FIG. 10 is a flowchart illustrating a method for routing a debug message through debugging circuitry.

FIGS. 1 to 6 are schematic diagrams of exemplary debug architectures, and components within debug architectures. These figures present the structures in terms of functional blocks. Some functional blocks for carrying out functions well known in the art have in places been omitted from these figures. FIGS. 4, 7 and 10 are flowcharts illustrating methods of routing debug messages through debugging circuitry. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

Figure 1:
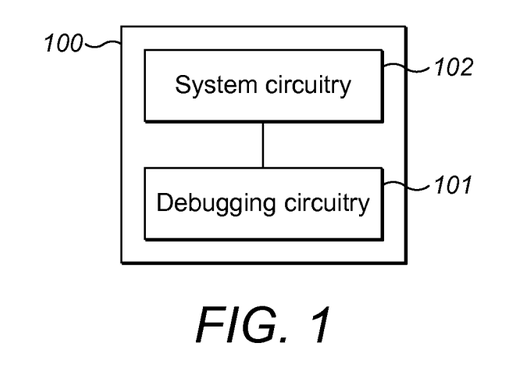
FIG. 1 is a schematic drawing of an exemplary debug architecture on an integrated circuit chip device.

FIG. 1 illustrates the general structure of an exemplary debug architecture for a SoC 100. Debugging circuitry 101 is arranged to debug system circuitry 102. FIG. 2 illustrates exemplary system circuitry comprising core devices and a communication interface. Core devices 201, 202 and 203 of the SoC are each connected to debugging circuitry 101. Although FIG. 2 illustrates three core devices, any number of core devices can be suitably integrated into the debug architecture. Exemplary core devices include a DSP (digital signal processor), video processor, applications processor or CPU (central processor unit), graphics processor, system memory, bus, system interconnect, RTOS (real-time operating system), software, data, custom circuit and a data engine. However, any component of a SoC is suitable for being incorporated into the debug architecture as a core device on FIG. 2. The core devices may be emulators or simulators of other devices on the chip. For example, a core device may emulate a processor.

The debugging circuitry is able to manipulate the operation of the core devices and monitor the operation of the core devices. The debugging circuitry is connected to a communication interface 204. Communication interface 204 may be configured to communicate with entities off-chip. For example, debugging circuitry 101 may communicate with an off-chip debug controller via communication interface 204.

Communication interface 204 may also be configured to communicate with other entities on-chip. For example, debugging circuitry 101 may communicate with an on-chip debug controller via communication interface 204. Although FIG. 2 illustrates one communication interface, any number of communication interfaces can be integrated onto the SoC. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe and CAN.

The structure of the debugging circuitry is implementation-dependent. FIG. 3 illustrates an example in which the debugging circuitry comprises a shared hub 304, debug units 301, 302, 303 and a communication adapter 305. In FIG. 3, each core device 201, 202, 203 of the SoC is respectively connected to its own debug unit 301, 302, 303. The debug units may be configured to passively or actively observe the attached core device. A debug unit which passively observes a core device is limited to analysing the output of that core device. Conversely, a debug unit which actively observes a core device may analyse the output of the core device, and additionally may control the core device to modify its operation. For example, the debug unit may control the core device to slow down the speed at which the core device operates or to stop a processor of the core device and restart it again. The communication interface 204 is connected to a communication adapter 305. The communication adapter adapts signals that it receives to a format that is suitable for the communication interface that it is connected to. The communication interface 204 communicates signals to an off-chip debug controller 306. Each debug unit and the communication adapter is connected to a shared hub 304. Shared hub 304 routes signals between the devices on the chip. For example, the shared hub routes messages between the debug units. The shared hub also routes messages between the communication adapter and the debug units. The shared hub may also comprise resources which are shared between the debug units. For example, the shared hub may comprise a shared buffer for use by the debug units. By locating such resources in the shared hub as opposed to in the debug units, the debug units are made smaller and hence can be more easily integrated across the chip.

FIG. 4 illustrates another exemplary structure of the debugging circuitry which comprises a mesh network of nodes 403, 404, 405, 406 and debug units 400, 401. In FIG. 4, core devices 201 and 202 are both connected to the same debug unit 400. Core device 203 is not directly connected to a debug unit. Debug unit 401 is connected to node 405 of the mesh network, but not directly connected to a core device. The communication interface 204 communicates signals to an on-chip debug controller 402. The mesh network of nodes routes messages between the components of the SoC.

The debugging circuitry may comprise other types of interconnection for routing messages between components of the SoC. For example, the debugging circuitry may comprise a bus or a ring network. Alternatively, the debugging circuitry may comprise any combination of one or more shared hubs, buses, ring networks and mesh networks.

The debugging circuitry comprises one or more debug units. A debug unit may be connected to a core device (as shown in FIG. 3). A debug unit may be connected to more than one core device (as shown in FIG. 4). A debug unit may be not directly connected to a core device, but connected to the interconnection of the debugging circuitry (as shown in FIG. 4).

The following description refers to an interconnect fabric. This interconnect fabric is internal circuitry of the debugging circuitry which routes debug messages through the debugging circuitry. The interconnect fabric may comprise circuitry which routes debug messages from on-chip units to off-chip units. The interconnect fabric may comprise circuitry which routes debug messages from off-chip units to on-chip units. The interconnect fabric may comprise circuitry which routes debug messages internally on the chip. For example, in FIG. 3 the interconnect fabric includes circuitry in the debug units, circuitry in the shared hub and circuitry in the communication adapter which routes debug messages. As another example, in FIG. 4, interconnect fabric includes circuitry in the debug units and the mesh network circuitry which routes debug messages. The interconnect fabric may comprise any combination of routing circuitry in debug units, communication adapters, shared hubs, buses, ring networks and mesh networks.

Suitably, the debugging circuitry is controlled by a debug controller. As described above, the debug controller may be located off-chip or on-chip. A debug controller located internally to the SoC has lower latency and higher performance compared to an off-chip debug controller. An alternative configuration may be implemented in which both an on-chip and an off-chip debug controller are used. In this situation, the off-chip debug controller is the dominant controller, in other words it acts as a master to the on-chip debug controller. The on-chip debug controller is more resource constrained than the off-chip debug controller. The division of control may be implemented such that the off-chip debug controller determines the debugging tasks to be implemented, and the on-chip debug controller buffers the tasks and schedules the timing of the next task in dependence on the other operations of the chip.

Suitably, the components of the debugging circuitry communicate using debug messages. These messages may be assembled into packets for transporting through the interconnect fabric of the debugging circuitry. The debug messages may contain control information to control the operation of part of the debugging circuitry or system circuitry. Alternatively, the debug messages may contain debug data. For example, the debug data may be trace data. Trace data is the output of a component of the system circuitry which a debug unit has recorded passively whilst that component of the system circuitry continues executing. The trace data may be program traces or data traces. As another example, the debug data may be the state of a performance counter. Performance counters may be used to count a variety of events from system circuitry, such as signal edges, clock cycles a signal is high or low for, time spent in a given operational state, time a register is at a specific value or within a prescribed range, or error conditions. This type of debug data may be used to infer the state or operation of part of the system circuitry, or to identify whether specific events have or have not occurred.

The debug data generated is often large in quantity and the bandwidth available to transport the debug data finite. Thus, efficient transport of the debug data through the interconnect fabric is important. The following describes a low-cost and low-latency interconnect fabric for routing debug messages. Typically, debug messages extend over several clock cycles. To reduce latency, debug messages are streamed into the interconnect fabric as they are received. In other words, the point of entry to the interconnect fabric (or the point of entry of a zone of the interconnect fabric, explained later) does not store a debug message as it is received until it has been fully received before routing it through the debugging circuitry because (i) this results in poor performance resulting from high latency in transporting the debug message through the interconnect fabric, and (ii) this requires additional chip area and power to store the data. The point of entry of the debug message to the interconnect fabric (or the point of entry of a zone of the interconnect fabric, explained later) holds only a sufficient amount of the message to enable it to effectively route the message through the interconnect fabric. For example, the point of entry may schedule the routing of the debug message according to a priority or flow control management procedure. As an additional example, the point of entry may hold the debug message before routing it on in order to synchronise the debug message to the timing of the interconnect fabric. For example, the sufficient amount is typically one or two clock cycles.

Figure 5:
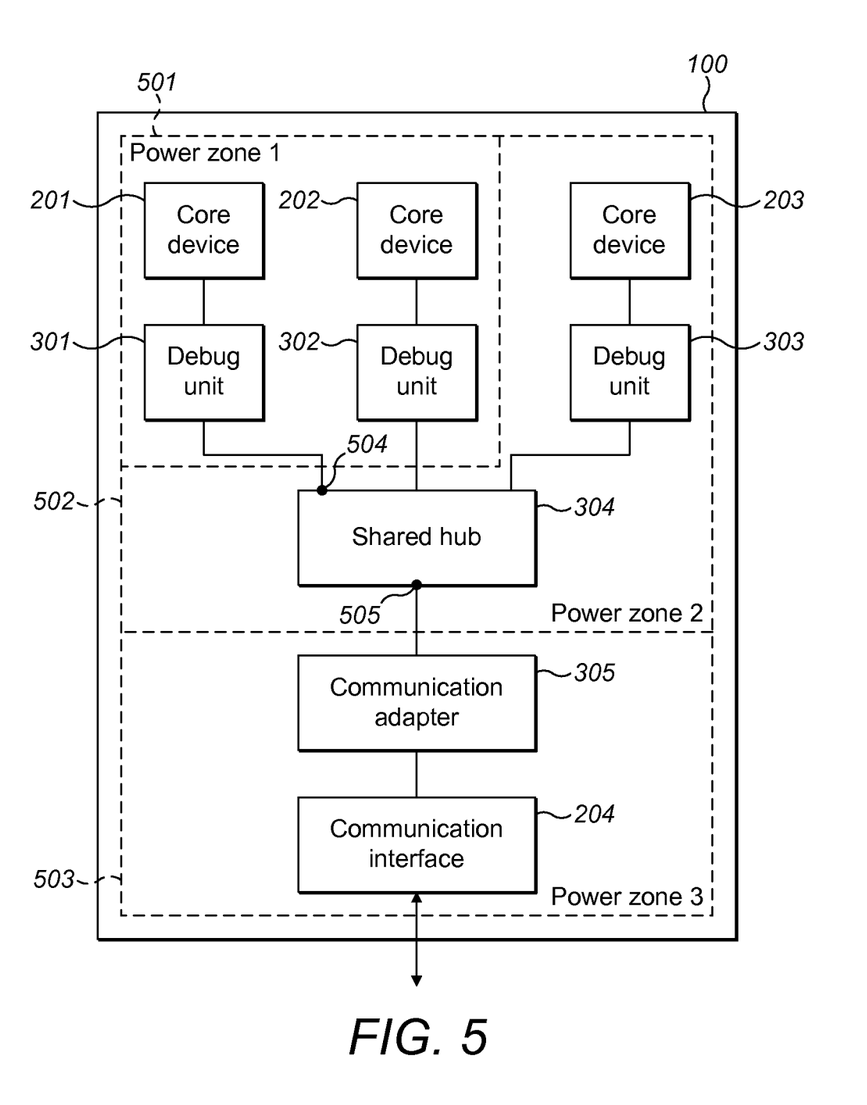
FIG. 5 is a schematic drawing of an exemplary debug architecture comprising power zones.

The SoC may have different power zones. At any time, the power levels of these power zones may be different. For example, one power zone may be fully powered whilst another power zone is powered down. As an example, FIG. 5 illustrates the SoC of FIG. 3 segmented into power zones. Power zone 1 labelled 501 comprises two core devices 201, 202 and their associated debug units 301, 302. Power zone 2 labelled 503 comprises core device 203, its associated debug unit 303 and shared hub 304. Finally, power zone 3 comprises communication adapter 305 and communication interface 204.

Figure 6:
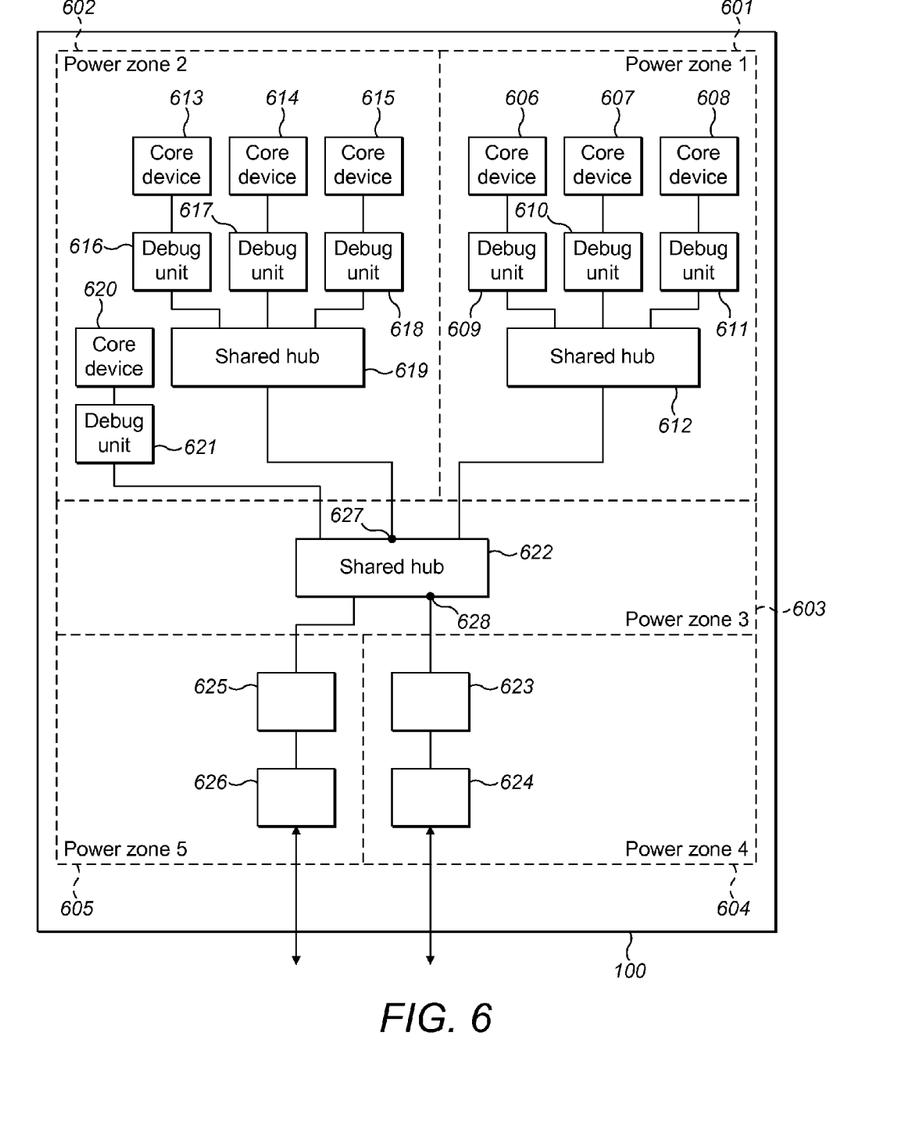
FIG. 6 is a schematic drawing of an exemplary debug architecture comprising power zones.
Figure 7:
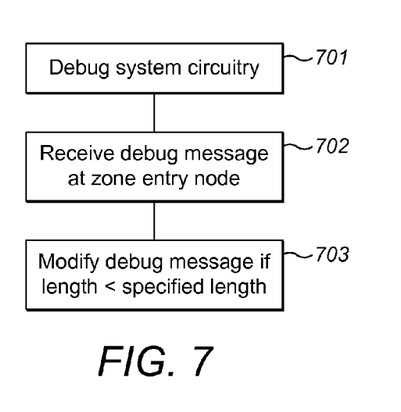
FIG. 7 is a flowchart illustrating a method for routing a debug message through debugging circuitry.

As a further example, FIG. 6 illustrates a further SoC segmented into five power zones. Power zone 1 labelled 601 comprises three core devices 606, 607, 608 and their associated debug units 609, 610, 611 and shared hub 612. Power zone 2 labelled 602 comprises core devices 613, 614, 615, 620 and their associated debug units 616, 617, 618, 621 and shared hub 619. Power zone 3 labelled 603 comprises shared hub 622. Power zone 4 labelled 604 comprises communication adapter 623 and communication interface 624. Power zone 5 labelled 605 comprises communication adapter 625 and communication interface 626.

Thus, the debugging circuitry may be segmented into power zones. The interconnect fabric of the debugging circuitry spreads across the different power zones. The node of the interconnect fabric at the entry of a zone is herein called a zone entry node. A zone entry node may be at a boundary of the debugging circuitry and the system circuitry. A zone entry node may be at a boundary of two zones, both of which comprise components internal to the debugging circuitry. The node of the interconnect fabric at the exit of a zone is herein called a zone exit node. A zone exit node may be at a boundary of the debugging circuitry and the system circuitry. A zone exit node may be at a boundary of two zones, both of which comprise components internal to the debugging circuitry. The interconnect fabric routes debug messages through a zone of the debugging circuitry from a zone entry node of that zone to a zone exit node of that zone.

As previously described, if a power zone powers down part way through sending a debug message, then the remainder of the debug message is not sent and hence the recipient of that debug message does not receive the full message. For example, in FIG. 5 debug unit 301 may be sending trace data of core device 201 to shared hub 304 when power zone 1 is powered down. Power zone 1 transitions from a powered up state to a powered down state whilst debug unit 301 is transmitting the trace data to shared hub 304. Thus, debug unit 301 may have sent part of a debug message but not all of the debug message to shared hub 304 before power zone 1 was powered down. Power zone 2 remains powered. Zone entry node 504 of power zone 2 may receive the partial debug message from debug unit 301 and expect it to have a particular length. As another example, in FIG. 6 shared hub 619 may be routing debug data from debug unit 617 to shared hub 622 when power zones 1 and 2 are powered down. Power zones 1 and 2 transition from a powered up state to a powered down state whilst the shared hub 619 is transmitting the debug data to shared hub 622. Shared hub 619 may have routed part but not all of a debug message to shared hub 622 before power zone 2 was powered down. Power zone 3 remains powered. Zone entry node 627 of power zone 3 may receive the partial debug message from shared hub 619 and expect it to have a particular length.

In known systems, when the recipient expects the debug message to have a particular length, it may deduce that part or all of the next received message is actually part of the debug message. Thus, the debug messages become corrupted, and may be sent to the wrong destination units. The following described apparatus and methods use the debugging circuitry to modify partially received debug messages to avoid propagation of corruption.

The following description describes a method of routing debug messages through debugging circuitry when the length of the debug messages has become corrupted, for example due to part of the debugging circuitry powering down when it is part way through sending a debug message. Referring to the flowchart of FIG. 7, at step 701 the debugging circuitry is debugging the system circuitry. At step 702, a zone entry node of the interconnect fabric receives a debug message. If the debug message is shorter than a specified length, then at step 703 the debug message is modified by increasing its length to equal that of the specified length. The specified length may be identified in the header of the debug message. Alternatively, the specified length may be a predetermined length. For example, the debugging circuitry may operate according to a protocol which mandates the specified length. By increasing the length of a truncated debug message to the length that downstream components expect the debug message to have, those downstream components maintain timing synchronisation with the debug messages in that they determine the boundaries between the debug messages to be where they are. Thus, if a debug message stream comprising truncated debug messages which have been modified to the specified length is buffered into memory, the individual debug messages can be extracted from the memory based only on the start address of the first message, as the length identified in the message header indicates where in the memory to find the header of the next message.

The modification of the shortened debug message may be implemented at a zone entry node. For example, the modification may be implemented at the zone entry node which (i) interfaces the powered down zone from which the debug message was sent, and (ii) is the zone entry node which first receives the debug message from the powered down zone. Referring to FIG. 5, the zone entry node which interfaces with the powered down zone 1 and first receives the debug message from the powered down zone 1 is zone entry node 504. Alternatively, the modification may be implemented at a zone exit node. For example, the modification may be implemented at the zone exit node which interfaces the next power zone that the debug message is to be routed through. Referring to FIG. 5, if the debug message is being sent to an off-chip debug controller, then the zone exit node which interfaces the next power zone 3 that the debug message is to be routed through is zone exit node 505. Alternatively, the modification may be implemented anywhere on the interconnect fabric of the debugging circuitry in the path of the debug message before it exits the interconnect fabric. For example, the modification may be implemented at a node which is at the boundary of the debugging circuitry where the debugging circuitry interfaces system circuitry.

Figure 8:
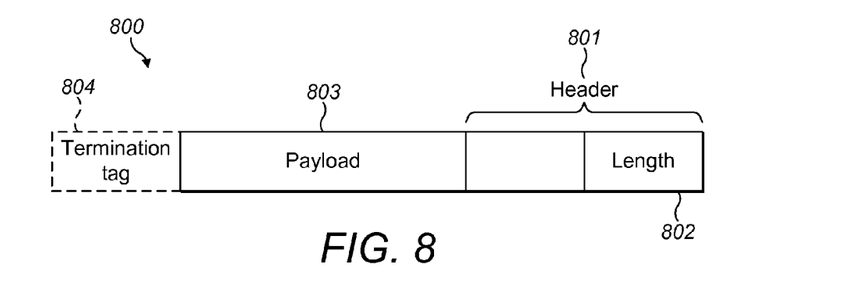
FIG. 8 illustrates a message format of a debug message.

If the modification of the debug message is implemented after the zone entry node which first receives the debug message from the powered down zone, then the interconnect fabric of the debugging circuitry is capable of correctly routing a truncated debug message. Suitably, this is implemented by the zone entry node which first receives the debug message from the powered down zone adding a termination tag to the received truncated debug message before routing the truncated debug message through the debugging circuitry. The debug message may then have the format illustrated in FIG. 8. The debug message 800 comprises a header 801 which optionally includes a length field 802 specifying the length of the debug message. The debug message 800 also comprises a payload 803 which is truncated such that the length of the whole debug message is less than the specified length of the debug message. Finally, the debug message 800 comprises a termination tag 804 at the end of the message which identifies the message end.

Alternatively, the zone entry node which first receives the debug message from the powered down zone may assert a signal in the interconnect fabric, the signal being associated with the debug message by downstream components, the signal indicating that the message has ended. Suitably, this end-of-message signal is asserted concurrently with the zone entry node routing the last available clock cycle of the debug message to the interconnect fabric. The circuitry downstream of the zone entry node routes the debug message in response to the termination tag or end-of-message signal rather than the specified length of the message (which is longer than the actual length of the message), thus the debug message is routed correctly through the interconnect fabric to the location at which the debug message is modified by increasing its length. In one example, the start of the message transfer is indicated by a signal called START and the end of a message transfer is indicated by a signal called END signal. The number of maximum bytes transferred can be determined by counting the number of clock cycles the message transfer was active for and multiplying it by the width of the data path.

The zone entry node adds the termination tag to the debug message or asserts the end-of-message signal in response to a determination that the debug message is shorter than the specified length. In a first example, the zone entry node counts the number of bytes in the debug message, compares this counted number of bytes to the specified length, determines that the counted number of bytes is less than the specified length, and adds the termination tag to the debug message or asserts the end-of-message signal. The zone entry node may initially read the header of the message to determine the specified length. Or alternatively, the zone entry node may have a priori knowledge of the specified length. In a second example, the zone entry node is informed that the power zone has been powered down. For example, the unit sending the message may indicate to the zone entry node that it is being powered down, for example by asserting a signal which is interpreted by the zone entry node as indicating that the unit sending the signal is being powered down. If the zone entry node is receiving a debug message from a power zone at the time that the zone entry node is informed that the power zone is being powering down, it adds the termination tag to the debug message or asserts the end-of-message signal.

FIG. 10 is a flowchart illustrating an exemplary method implemented by the part of the debugging circuitry which modifies the length of the debug message. At step 1001, the next debug message is received. The specified length of the debug message is read from the header of the message at step 1002. The number of bytes in the debug message are counted at step 1003. In one example, the protocol of the debugging circuitry is at the zone entry node to assert a START signal concurrent with the beginning of a transmitted message, and to assert an END signal concurrent with the end of the transmitted message. In this case, the number of bytes in the debug message between the asserted START signal and the asserted END signal is counted. In this example, the zone entry node asserts the START signal and the END signal. The END signal may be asserted for truncated debug messages as explained above.

At step 1004, the number of bytes in the debug message is compared to the number of bytes of the specified length. If the number of bytes in the debug message is not less than the number of bytes in the specified length, then the method moves to step 1005 in which the debug message is routed to a destination unit without increasing its length. The destination unit is the unit (either on or off chip) that is the intended recipient of the debug message. The flowchart then returns to step 1001 where the next debug message is received.

If, at step 1004, the number of bytes in the debug message is less than the number of bytes in the specified length, the debug message is modified by increasing its length to equal the specified length at step 1006. Suitably, the length of the payload of the debug message is increased. Suitably, the payload is extended with data which is interpreted by the destination unit to be inert. For example, the payload may be padded out with all 0s or all 1s. For example, in the case that the debug message is a control debug message which is being routed to a component of the debugging circuitry, that component suitably interprets the presence of the inert data such that it does not modify its configuration in a way that would corrupt the operation of that component or the debugging circuitry. Thus, the modified message has the expected format even though the payload of the modified message is corrupt. The modified message is then routed to the destination unit at step 1008. If the method of FIG. 10 is implemented at a zone exit node, the modified debug message may then be outputted to the next zone. In the case that the zone exit node is located at the boundary between the debugging circuitry and the system circuitry, the modified debug message may be outputted to system circuitry. Following step 1008, the method returns to step 1001 and the next debug message is received.

Figure 9:
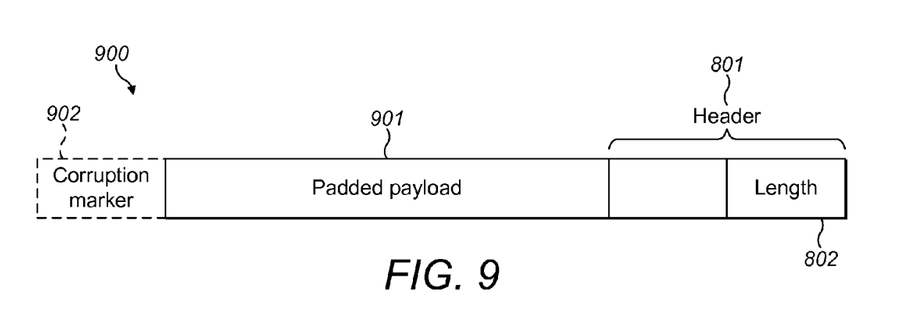
FIG. 9 illustrates a message format of a debug message.

Optionally, prior to routing the modified debug message to its destination unit, a corruption marker may be added to the modified debug message at step 1007. This corruption marker identifies that the modified debug message is corrupted. FIG. 9 illustrates a message format of a debug message after it has been modified and a corruption marker added to it. The modified debug message 900 comprises a header 801 which optionally includes a length field 802. The modified debug message 900 also includes a padded payload 901 which is extended compared to the payload 803 of FIG. 8. The modified debug message 900 also includes a corruption marker 902. In an alternative example, the corruption marker may be added to a debug message following the modified debug message. Suitably, the corruption marker is added to the debug message immediately following the modified debug message. In this case, the destination unit interprets the corruption marker as indicating that the previous debug message is corrupted.

Suitably, the debug message format is arranged such that a designated bit is one value, for example 0, if the message has not been extended, and another value, for example 1, if the message has been extended. Suitably, this designated bit is the last bit of the message. In this case, the corruption marker may be implemented by changing the designated bit from the value indicating the message has not been extended to the value indicating that the message has been extended.

Suitably, the destination unit discards debug messages which are identified as corrupted. For example, the debug message may be debug data routed from a debug unit to a debug controller. The debug controller may be on or off chip. In response to the corruption marker, the debug controller may discard the debug data in that message. As another example, the destination unit may be a debug component that buffers whole messages before acting upon them. In this case, the debug component discards the debug message in response to the corruption marker.

If the method of FIG. 10 is implemented by circuitry prior to the zone exit node, the zone exit node may discard the modified debug message in response to the corruption marker.

Although the lengths of the debug messages described herein have been corrupted as a result of a zone powering down whilst part way through transmitting the debug message, the methods and apparatus described herein are applicable to the lengths of debug messages having been corrupted for any other suitable reason.

Each component of the SoCs illustrated in FIGS. 1 to 6 may be implemented in dedicated hardware. Alternatively, each component of the SoC illustrated in FIGS. 1 to 6 may be implemented in software. Some components may be implemented in software, whilst other components are implemented in dedicated hardware.

Suitably, debugging circuitry 101 including any debug units and communication interfaces are hardware circuits forming part of SoC 100. Preferably, debug units for controlling and/or monitoring complex core devices and peripherals such as processors use suitably complex state machines as part of their control unit. Suitably, communication interfaces use suitably complex state machines to implement their complex protocols. Various approaches to realising state machines are known. Such state machines can be realised using: (i) only logic gates; (ii) a combination of logic gates and memory, where the memory is used to contain tables of values to simplify the state machine's operation or to make it programmable; or (iii) a processor core to execute software stored in memory. Where a processor core is used it can be: (i) integral to the specific debug unit, communication interface, or other debugging circuitry; or (ii) shared between several debug units to reduce their implementation resources and cost.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. Further software can be provided at the computing-based device to implement the methods described herein. The methods described herein may be performed by software in machine readable form on a tangible storage medium.

The above description describes the system circuitry and debugging circuitry as being comprised on the same SoC. In an alternative implementation, the system circuitry and debugging circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the debugging circuitry may be distributed across more than one integrated circuit chip of the MCM. Thus, the method and apparatus described above in the context of an SoC also apply in the context of an MCM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit chip device comprising:
    system circuitry;
    debugging circuitry configured to debug the system circuitry, the debugging circuitry being segmented into zones;
    wherein the debugging circuitry comprises an interconnect fabric configured to route debug messages through a zone from a zone entry node of the interconnect fabric to a zone exit node of the interconnect fabric; and
    wherein the debugging circuitry is configured to, on receiving a debug message at a zone entry node that is shorter than a specified length, modify the debug message to form a modified debug message by increasing the length of the debug message to the specified length.

2. An integrated circuit chip device as claimed in claim 1, wherein the zones are power zones, and one zone is configured to be in a high power mode whilst another zone is configured to be in a low power mode, and wherein the debugging circuitry is configured to receive the debug message at the zone entry node from a zone which transitioned from a high power mode to a low power mode whilst sending the debug message.

3. An integrated circuit chip device as claimed in claim 1, wherein the debugging circuitry is configured to receive the debug message from a portion of the system circuitry which transitioned from a high power mode to a low power mode whilst sending the debug message.

4. An integrated circuit chip device as claimed in claim 1, wherein the zone entry node is configured to modify the debug message.

5. An integrated circuit chip device as claimed in claim 1, wherein the zone exit node is configured to modify the debug message.

6. An integrated circuit chip device as claimed in claim 1, wherein the debugging circuitry comprises debug units, and wherein the interconnect fabric is configured to route the debug message from a debug unit to a debug controller.

7. An integrated circuit chip device as claimed in claim 6, further comprising the debug controller.

8. An integrated circuit chip device as claimed in claim 1, wherein the debugging circuitry comprises a destination unit, and wherein the interconnect fabric is configured to route the debug message to the destination unit, and wherein the destination unit is configured to not change its configuration in response to receiving a modified debug message.

9. An integrated circuit chip device as claimed in claim 1, wherein the system circuitry and debugging circuitry are integrated on the same integrated circuit chip.

10. An integrated circuit chip device as claimed in claim 1, wherein the system circuitry and debugging circuitry are comprised across two or more integrated circuit chips of a multi-chip module.

11. A method of routing debug messages through an integrated circuit chip device comprising system circuitry and debugging circuitry, the debugging circuitry being segmented into zones, the debugging circuitry comprising an interconnect fabric, the method comprising:
    debugging the system circuitry;
    routing debug messages through a zone of the debugging circuitry from a zone entry node of the interconnect fabric to a zone exit node of the interconnect fabric;
    receiving a debug message at a zone entry node that is shorter than a specified length; and
    modifying the debug message to form a modified debug message by increasing the length of the debug message to the specified length.

12. A method as claimed in claim 11, comprising outputting the modified debug message from the zone exit node.

13. A method as claimed in claim 11, wherein the zones are power zones, the method comprising powering one zone in a high power mode whilst powering another zone in a low power mode.

14. A method as claimed in claim 13, comprising receiving the debug message from a zone which transitioned from a high power mode to a low power mode whilst sending the debug message.

15. A method as claimed in claim 11, comprising receiving the debug message from a portion of the system circuitry which transitioned from a high power mode to a low power mode whilst sending the debug message.

16. A method as claimed in claim 11, comprising determining that the debug message is shorter than the specified length by:
    counting the number of bytes in the debug message;
    comparing the counted number of bytes to the specified length; and
    determining that the counted number of bytes is less than the specified length.

17. A method as claimed in claims 11, comprising, at the zone entry node:
    determining that the debug message is shorter than the specified length; and
    adding a termination marker to the debug message to identify the end of the debug message.

18. A method as claimed in claim 11, comprising adding a corruption marker to the debug message to indicate that the debug message is corrupted.

19. A method as claimed in claim 18, comprising at the zone exit node, discarding debug messages which have been indicated as corrupted by a corruption marker.

20. A method as claimed in claim 11, comprising routing the debug message to an off-chip debug controller.

\* \* \* \* \*